United States Patent
Hsu et al.

(10) Patent No.: US 7,605,462 B2
(45) Date of Patent: Oct. 20, 2009

(54) UNIVERSAL SUBSTRATE FOR A SEMICONDUCTOR DEVICE HAVING SELECTIVELY ACTIVATED FUSES

(75) Inventors: Hung-Hsin Hsu, Hsinchu (TW); Chi-Chung Yu, Hsinchu (TW)

(73) Assignee: Powertech Technology Inc., Hukou Shiang, Hsinchu (TW)

( * ) Notice: Subject to any disclaimer, the term of this patent is extended or adjusted under 35 U.S.C. 154(b) by 51 days.

(21) Appl. No.: 11/709,883

(22) Filed: Feb. 23, 2007

(65) Prior Publication Data

US 2008/0203555 A1    Aug. 28, 2008

(51) Int. Cl.
*H01L 23/48* (2006.01)

(52) U.S. Cl. .................. 257/693; 257/E23.067; 257/E23.07; 257/E23.125; 257/E23.149; 257/668; 257/728; 257/698; 257/690; 257/691; 257/692

(58) Field of Classification Search .............. 257/693, 257/E23.067, E23.07, E23.125, E23.149, 257/692, 691, 690, 698, 728, 725, 668
See application file for complete search history.

(56) References Cited

U.S. PATENT DOCUMENTS

| | | | | |
|---|---|---|---|---|
| 5,809,312 | A * | 9/1998 | Ansel et al. | 713/300 |
| 6,410,366 | B1 * | 6/2002 | Hashimoto | 438/125 |
| 6,815,808 | B2 * | 11/2004 | Hyodo et al. | 257/678 |
| 2003/0020155 | A1 * | 1/2003 | Shinonaga et al. | 257/691 |
| 2005/0157557 | A1 * | 7/2005 | Perlov et al. | 365/185.21 |

* cited by examiner

*Primary Examiner*—Alexander O Williams
(74) *Attorney, Agent, or Firm*—Troxell Law Office, PLLC (57) ABSTRACT

A universal substrate includes a plurality of inner pads and a plurality of outer pads. A plurality of bifurcate wirings and a plurality of fuses are formed on a surface of the substrate. The fuses are connected with the bifurcate wirings in series. By the bifurcate wirings and the fuses, each of the inner pads is electrically connected to all of the outer pads to provide optional electrical disconnections therebetween. Accordingly, the universal substrate can provide for various chips with different serial arrangements of bonding pads without replacing or manufacturing another kind of substrate.

7 Claims, 9 Drawing Sheets

| Arrange sequence of bonding pads | F1 | F2 | F3 | F4 | F5 | F6 | F7 | F8 | F9 | F10 | F11 | F12 |
|---|---|---|---|---|---|---|---|---|---|---|---|---|
| CP1-CP2-CP3 | X | O | X | X | X | O | X | X | X | O | O | X |
| CP1-CP3-CP2 | X | O | X | O | X | X | X | O | X | O | X | X |
| CP2-CP1-CP3 | X | X | X | X | X | X | X | X | O | O | O | O |
| CP2-CP3-CP1 | O | X | X | O | X | X | O | X | X | O | X | X |
| CP3-CP1-CP2 | X | X | O | X | X | X | X | O | X | O | X | O |
| CP3-CP2-CP1 | X | X | O | X | X | X | O | X | X | O | O | X |

UNIVERSAL SUBSTRATE FOR A SEMICONDUCTOR DEVICE HAVING SELECTIVELY ACTIVATED FUSES

FIELD OF THE INVENTION

The present invention is relating to a substrate for semiconductor packages, more particularly to a universal substrate and a semiconductor device utilizing the substrate.

BACKGROUND OF THE INVENTION

Semiconductor devices, such as BGA semiconductor packages or card type semiconductor devices, generally utilize a substrate serving as electrical interconnection for chip, wherein the substrate has a plurality of outer pads able to directly serve as external contact electrodes or connecting external terminals, such as tin balls or metal pins. In order to match a predetermined socket specification, the location and electrical functions of the outer pads of substrate cannot be changed, however there still are different serial arrangements in bonding pads of chips according to various designations or/and manufactures of wafer for even the semiconductor chip with same electrical functions. Therefore, while serial arrangement of bonding pads of chip is once changed resulting in a problem that original substrate is no longer applied for different chip, it is necessary to design or replace another substrate having corresponding wiring pattern for application so that substrate variety will be increased without limitation. Besides, the lead time for manufacturing substrate also becomes longer.

Figure 1:
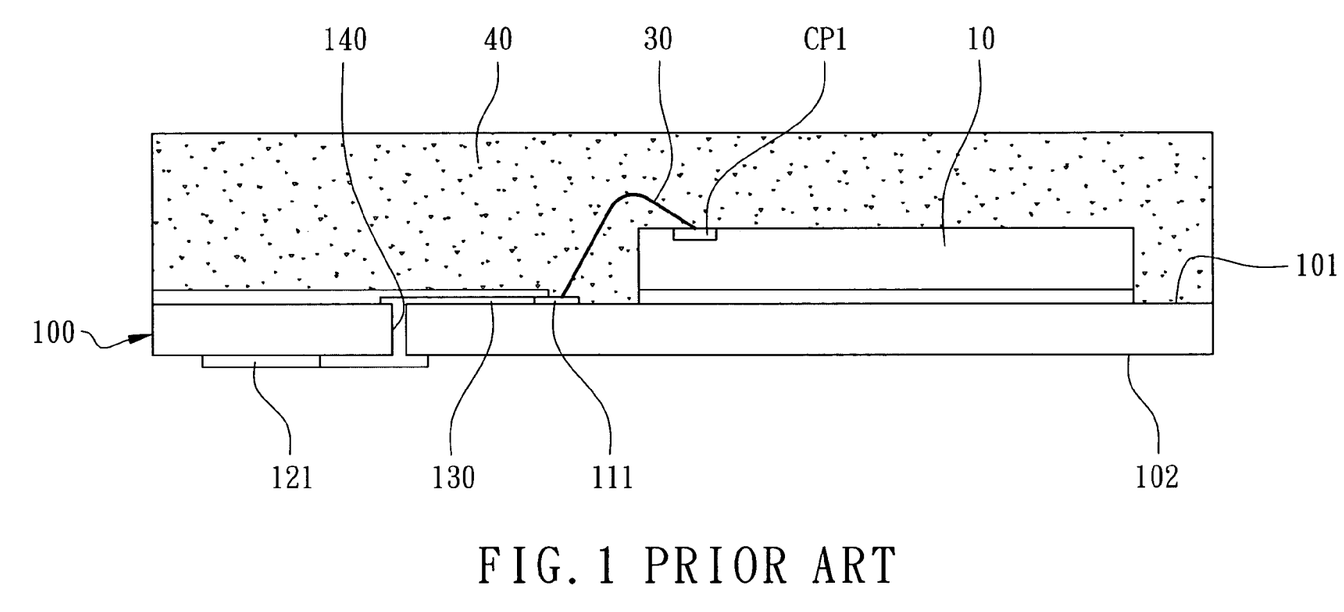
FIG. 1 is a cross-sectional view of a semiconductor device utilizing an exclusive substrate.
Figure 2:
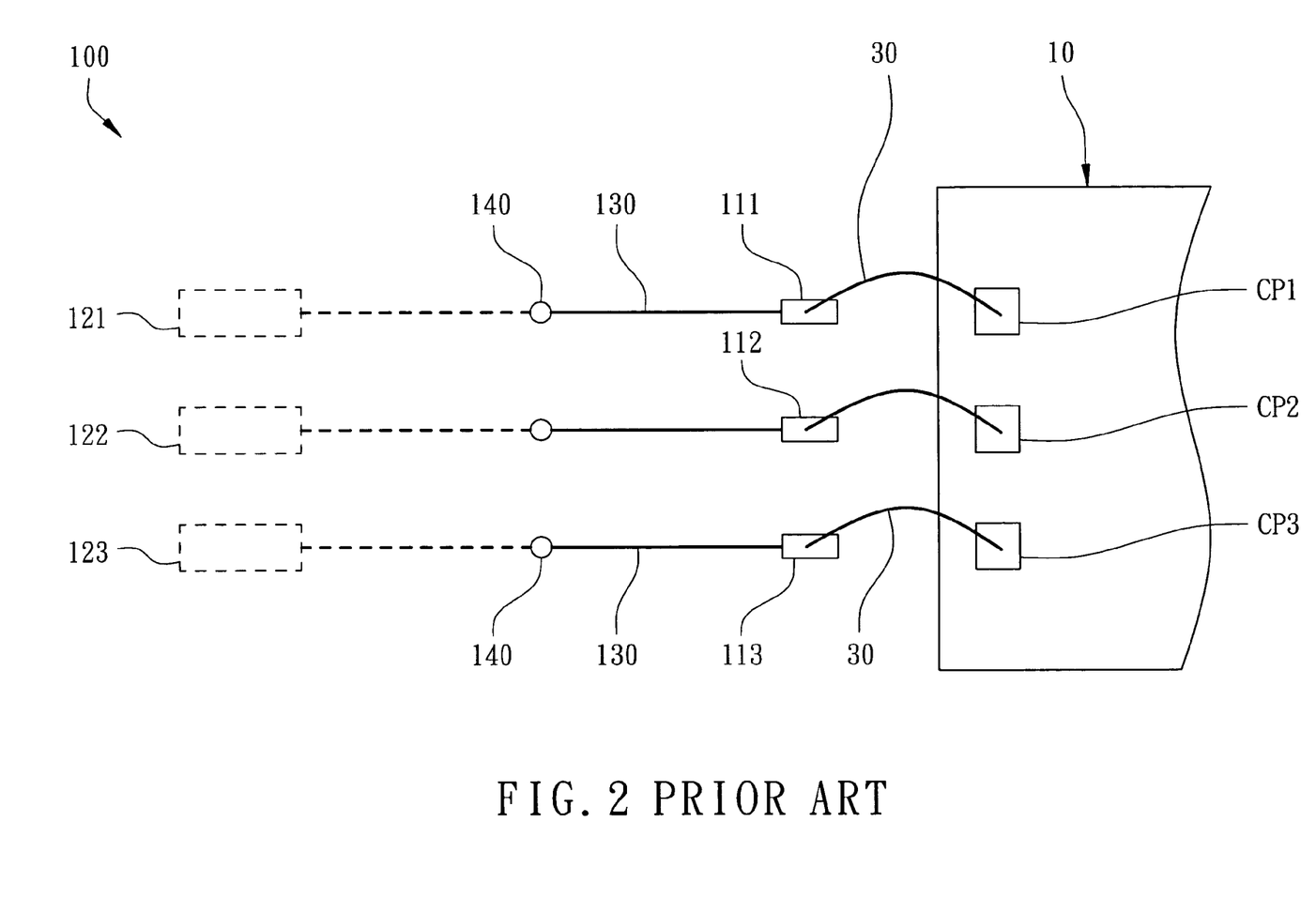
FIG. 2 shows wiring layouts on an upper surface of a known exclusive substrate and a proper chip electrically connected to the exclusive substrate.

Referring to FIG. 1, a semiconductor device, such as a memory card, mainly comprises a substrate 100, a chip 10, a plurality of bonding wires 30 and a molding compound 40. As shown in FIG. 2, the substrate 100 has a plurality of inner pads 111, 112 and 113, a plurality of outer pads 121, 122 and 123, a plurality of wirings 130 and a plurality of plated through holes 140 or electrical vias. The inner pads 111, 112 and 113 are disposed on an upper surface 101 of the substrate 100 and the outer pads 121, 122 and 123 are disposed on a lower surface 102 of the substrate 100. The inner pads 111, 112 and 113 are electrically connected to the corresponding outer pads 121, 122 and 123 through a controller (not shown in figures) by the wirings 130 and the plated through holes 140. The chip 10 is disposed on the upper surface 101 of the substrate 100 and has a plurality of bonding pads arranged from up to down in order of CP1, CP2 and CP3 as shown in FIG. 2, wherein the bonding pads CP1, CP2 and CP3 are electrically connected to the inner pads 111, 112 and 113 respectively by a plurality of bonding wires 30. The molding compound 40 is formed on the upper surface 101 of the substrate 100 to encapsulate the chip 10 and the bonding wires 30.

Referring to FIG. 2, the inner pads are numbered as a first inner pad 111, a second inner pad 112 and a third inner pad 113 in turn and the outer pads are numbered as a first outer pad 121, a second outer pad 122 and a third outer pad 123 in turn. Also, the bonding pads CP1, CP2 and CP3 are numbered as a first bonding pad CP1, a second bonding pad CP2 and a third bonding pad CP3 according to their serial arrangement and functions. Referring to FIG. 2 again, the first bonding pad CP1 is electrically connected to the first inner pad 111 by the bonding wire 30 in order to electrically connect to the first outer pad 121 via the wiring 130 and PTH 140. Similarly, the second bonding pad CP2 is electrically connected to the second inner pad 112 by wire-bonding in order to electrically connect to the second outer pad 122, and the third bonding pad CP3 is electrically connected to the third inner pad 113 by wire-bonding in order to electrically connect to the third outer pad 123.

Figure 3:
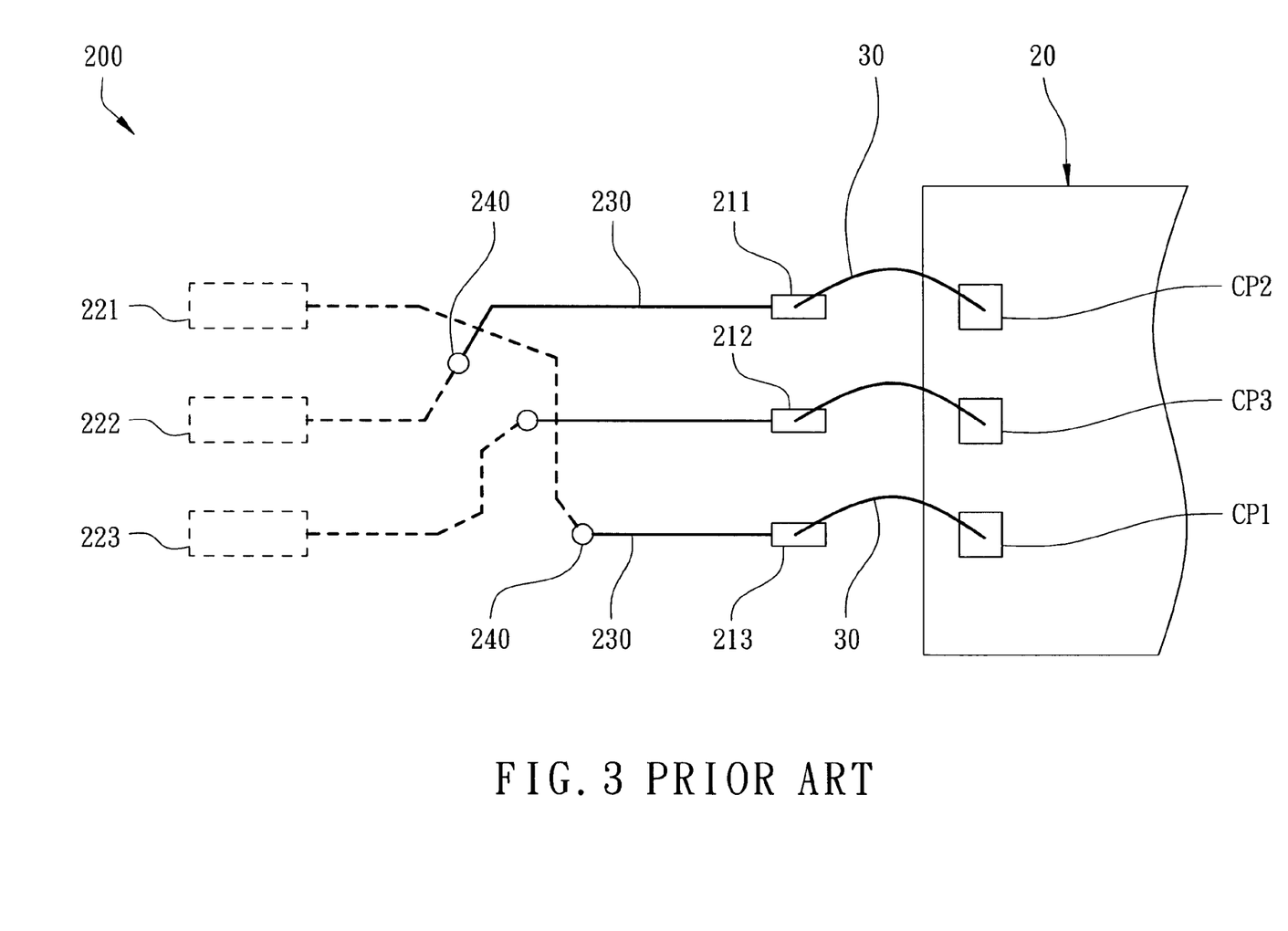
FIG. 3 shows wiring layouts on an upper surface of another known exclusive substrate and another proper chip electrically connected to the exclusive substrate.

Referring to FIG. 3, when another chip 20 has a different serial arrangement of bonding pads arranged in order of the second bonding pad CP2, the third bonding pad CP3 and the first bonding pad CP1 from up to down, in order to match a same product socket that the first bonding pad CP1 is still needed to be electrically connected to the first outer pad 121 at the same location of substrate 100. Similarly, the second bonding pad CP2 is also needed to be electrically connected to the second outer pad 122 at the same location of substrate 100 and the third bonding pad CP3 is also needed to be electrically connected to the third outer pad 123 at the same location of substrate 100. The original substrate 100 is no longer applied for the chip 20 having different serial arrangement of bonding pads so that it is necessary to design and manufacture another known exclusive substrate 200 which includes a plurality of inner pads 211, 212 and 213, a plurality of outer pads 221, 222 and 223, a plurality of wirings 230 and a plurality of plated through holes 240. According to different serial arrangement of bonding pads, the exclusive substrate 200 has a different inner wiring layout from the foregoing original substrate 100. As shown in FIG. 3, the first outer pad 221 is electrically connected to the third inner pad 213 by proper wiring 230 and PTH 240, the second outer pad 222 electrically connected to the first inner pad 211 and the third outer pad 223 electrically connected to the second inner pad 212. When manufacturing a semiconductor device, the bonding wires 30 are formed to electrically connect the third inner pad 213 to the first bonding pad CP1, the first inner pad 211 to the second bonding pad CP2 and the second inner pad 212 to the third bonding pad CP3. By means of modifying the inner wiring pattern of substrate, the ultimate purpose that the first outer pad 221 is electrically connected to the first bonding pad CP1 of the chip 20, the second outer pad 222 is electrically connected to the second bonding pad CP2 of the chip 20 and the third outer pad 223 is electrically connected to the third bonding pad CP3 of the chip 20 can be achieved. Therefore, while the serial arrangement of the bonding pads of chip is changed, it tends to replace or remanufacture another substrate 20 with different wiring pattern that results in increasing substrate variety and widely prolongs lead time for manufacturing substrate to be disadvantageous in sample manufacture and small quantity production.

SUMMARY OF THE INVENTION

The primary object of the present invention is to provide a universal substrate for various chips with different serial arrangements of bonding pads without replacing or remanufacturing substrate having different wiring pattern. The universal substrate may be electrically connected to various chips with different serial arrangements of bonding pads only by optionally breaking moderate fuses to follow coincident socket specification of semiconductor device, thus the lead time for redesigning and remanufacturing substrate wirings will be greatly shortened.

The secondary object of the present invention is to provide a universal substrate with selectively and easily blown fuses on a same surface of the universal substrate.

One aspect of the present invention provides a universal substrate that mainly comprises a plurality of inner pads and a plurality of outer pads. A plurality of bifurcate wirings and a plurality of fuses connected to the bifurcate wirings in series are formed on a surface of the substrate for allowing each of the inner pads to be electrically connected to all of the outer pads except for dummy pad(s) and providing an optional electrical disconnection. In other embodiment, the universal substrate may further comprise a solder resist layer that has a plurality of openings to expose some sections of the bifurcate wirings for forming fuses. Moreover, the present invention further discloses a semiconductor device utilizing the universal substrate.

DETAILED DESCRIPTION OF THE INVENTION

Figure 4:
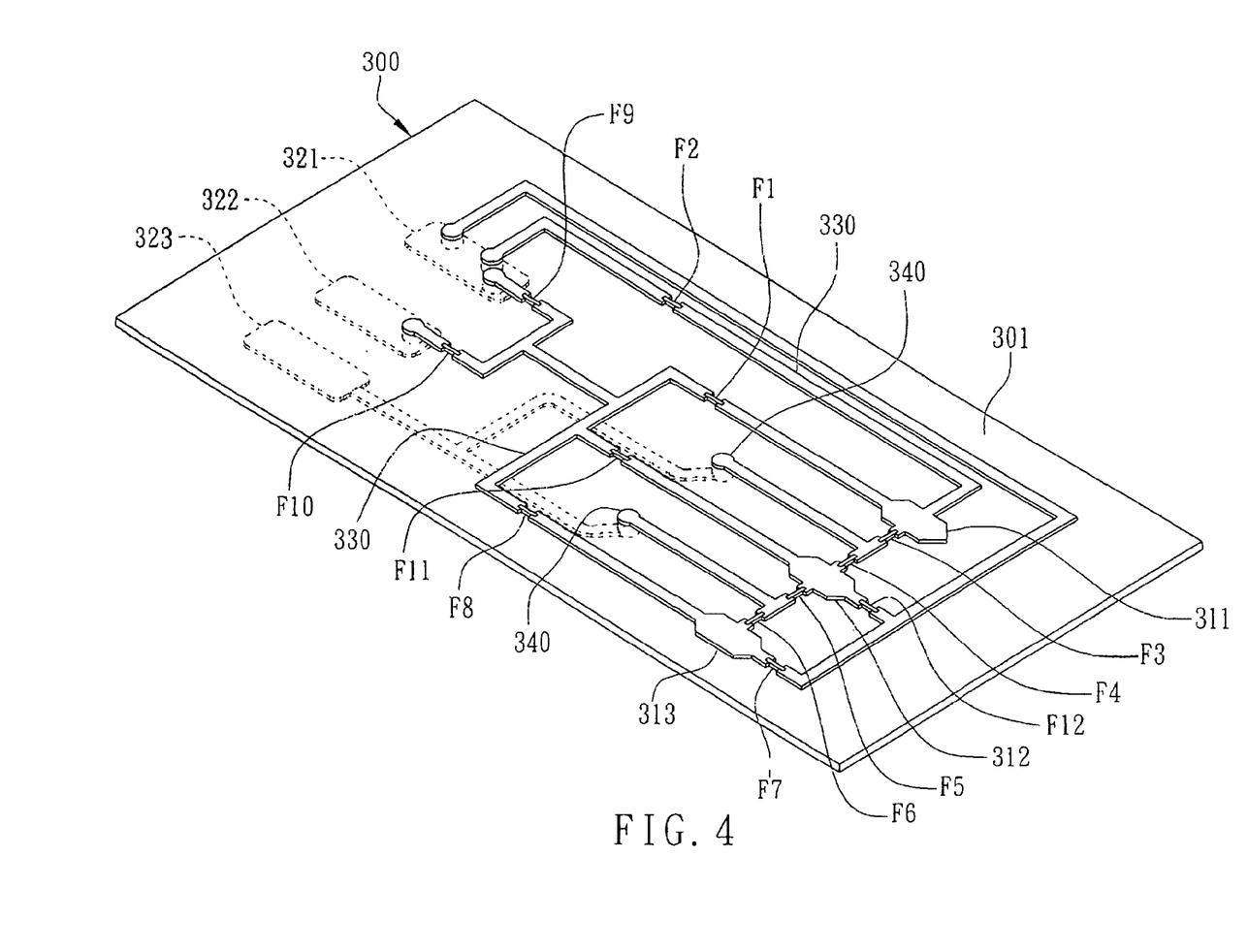
FIG. 4 shows a perspective view of wiring layouts on an upper surface of a universal substrate in accordance with a preferred embodiment of the present invention.

The present invention discloses a universal substrate. Referring to FIG. 4, the universal substrate 300 mainly comprises a plurality of inner pads 311, 312 and 313 and a plurality of outer pads 321, 322 and 323. In this embodiment, the inner pads 311, 312 and 313 may be divided into a first inner pad 311, a second inner pad 312 and a third inner pad 313 in turn, and similarly the outer pads 321, 322 and 323 may also be divided into a first outer pad 321, a second outer pad 322 and third outer pad 323 in turn. Preferably, the universal substrate 300 is applied for memory card type semiconductor device, where the inner pads 311, 312 and 313 may be wiring-bonding fingers and the outer pads 321, 322 and 323 may also be gold fingers in strip shape.

Figure 5:
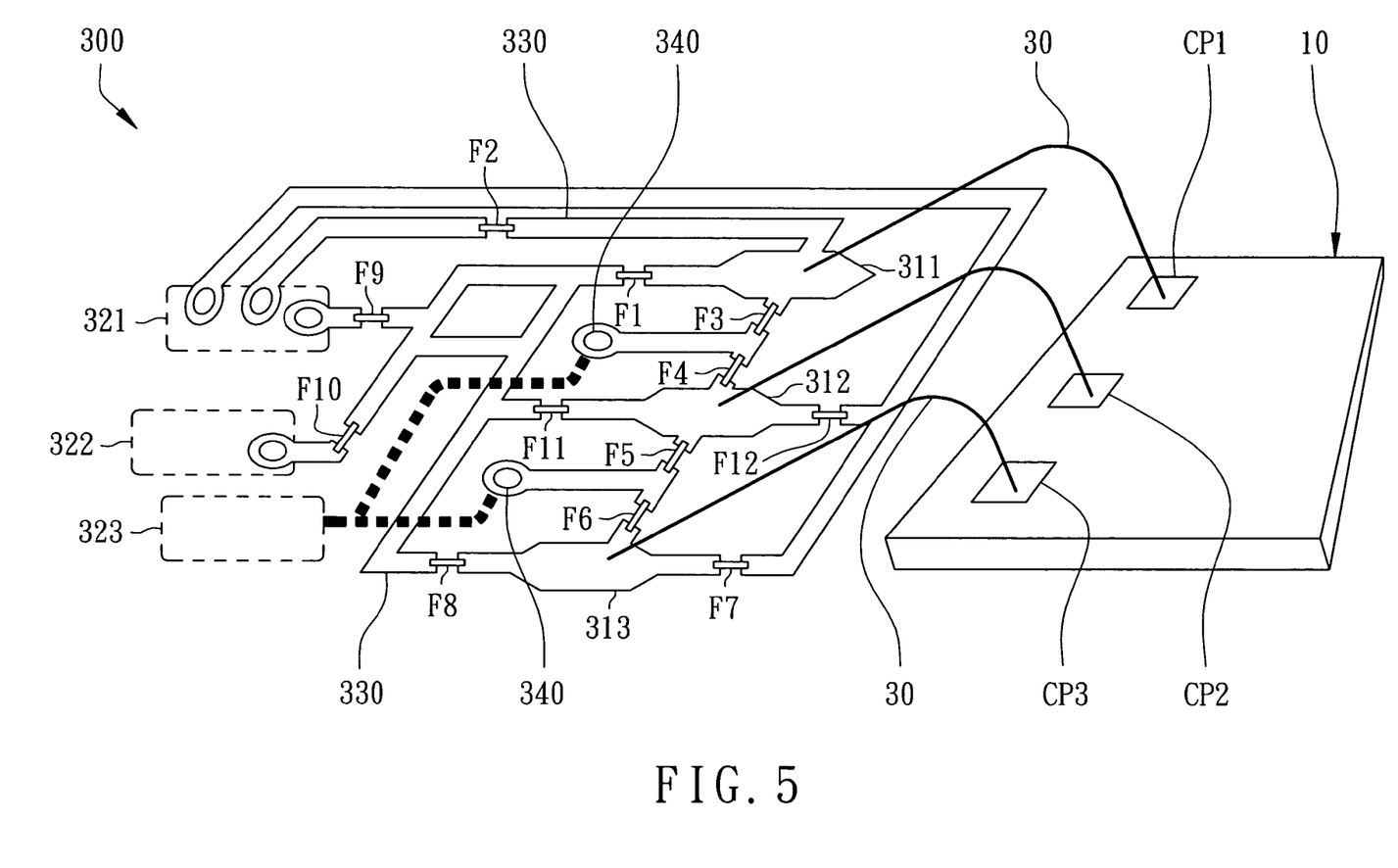
FIG. 5 is a perspective view of the universal substrate and a chip electrically connected to the universal substrate in accordance with the embodiment of the present invention.

Referring again to FIG. 4 and FIG. 5, a plurality of bifurcate wirings 330 and a plurality of fuses F1, F2, F3, F4, F5, F6, F7, F8, F9, F10, F11 and F12 connected to the bifurcate wirings 330 in series are formed on a same surface of the universal substrate 300 to enable each of the inner pads 311, 312 and 313 to be electrically connected to all of the outer pads 321, 322 and 323 except for dummy pad(s) and provide optional electrical disconnections. In this embodiment, the bifurcate wirings 330 may include T-joint or Y-joint traces, or/and some of the bifurcate wirings 330 may also be in a cross shape. Referring to FIG. 5, the fuses F1, F2, F3, F4, F5, F6, F7, F8, F9, F10, F11 and F12 are parts of a wiring pattern and typically narrower than the bifurcate wirings 330 in width, and the fusible wirings can be optionally blown out by laser to form various electrical disconnections, are generally more than double the inner pads 311, 312 and 313 in quantity, and preferably may be formed on a same surface (that is the upper surface 301) of the substrate 300 to perform fuse-blowing operation conveniently that is able to optionally blow out some of the fuses F1, F2, F3, F4, F5, F6, F7, F8, F9, F10, F11 and F12 for obtaining any optically electrical transmitting connections (which will be described below).

Figure 9:
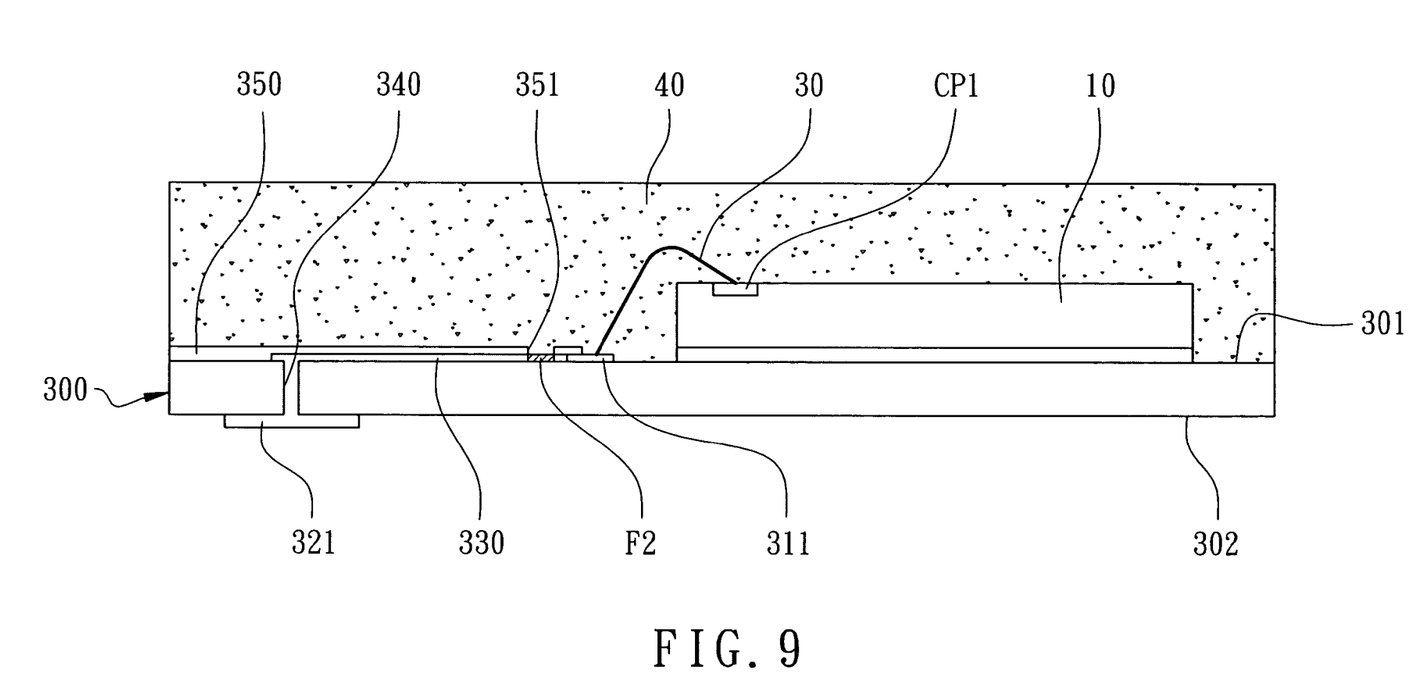
FIG. 9 is a cross-sectional view of a semiconductor device utilizing the universal substrate in accordance with the embodiment of the present invention.

In this embodiment, referring to FIG. 9, the universal substrate 300 can be defined as an upper surface 301 and a lower surface 302, some of the bifurcate wirings 330. The fuses F1, F2, F3, F4, F5, F6, F7, F8, F9, F10, F11 and F12 and the inner pads 311, 312 and 313 may be formed on the upper surface 301 of the substrate 300, and the outer pads 321, 322 and 323 are formed on the lower surface 302 of the substrate 300. The universal substrate 300 may further comprise a plurality of plated through holes (PTH) 340 to provide double-sided electrical connections.

In practice, a solder resist layer 350 can be formed on the upper surface 301 of the universal substrate 300 to encapsulate the bifurcate wirings 330 to prevent them from contamination because of exposure resulting in short circuit. Preferably, the solder resist layer 350 has a plurality of openings 351 that are equal to the fuses in quantity to respectively expose the corresponding fuses F1, F2, F3, F4, F5, F6, F7, F8, F9, F10, F11 and F12 advantageous to blow out some of them easily. In other embodiments, the openings 351 of the solder resist layer 350 expose some sections of the bifurcate wirings 330 to form breakable fuses.

Figure 6:
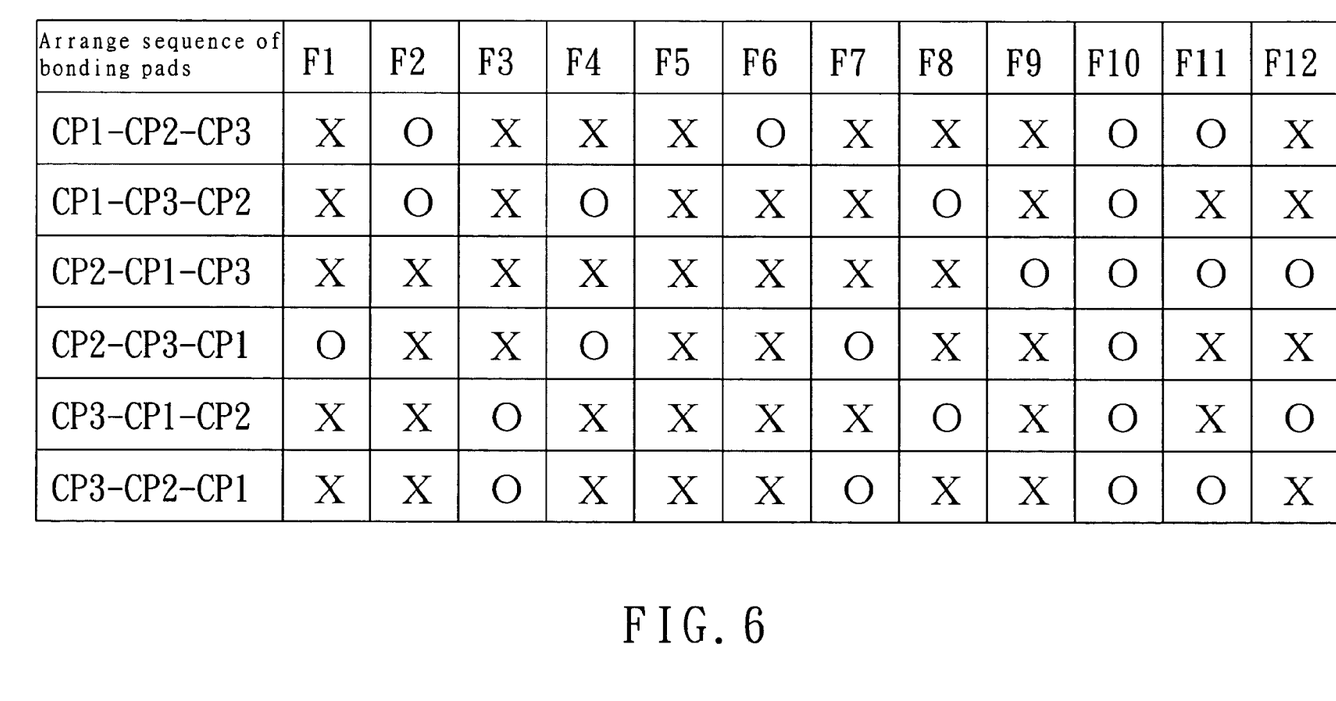
FIG. 6 is a comparable chart showing switching states of a plurality of fuses while the universal substrate is connected to various chips having different serial arrangements of bonding pads in accordance with the embodiment of the present invention.

Since chips that have same functions but are manufactured by different makers have various serial arrangements of the bonding pads, some of the fuses F1, F2, F3, F4, F5, F6, F7, F8, F9, F10, F11 and F12 need to be blown out to justify wiring connections on the universal substrate 300 according to various serial arrangements of the bonding pads. Referring to FIG. 6, "O" shows that the corresponding fuse is connected and "X" shows that the corresponding fuse is disconnected, wherein the fuses F1, F2, F3, F4, F5, F6, F7, F8, F9, F10, F11 and F12 can be optionally blown out with a laser.

Figure 7:
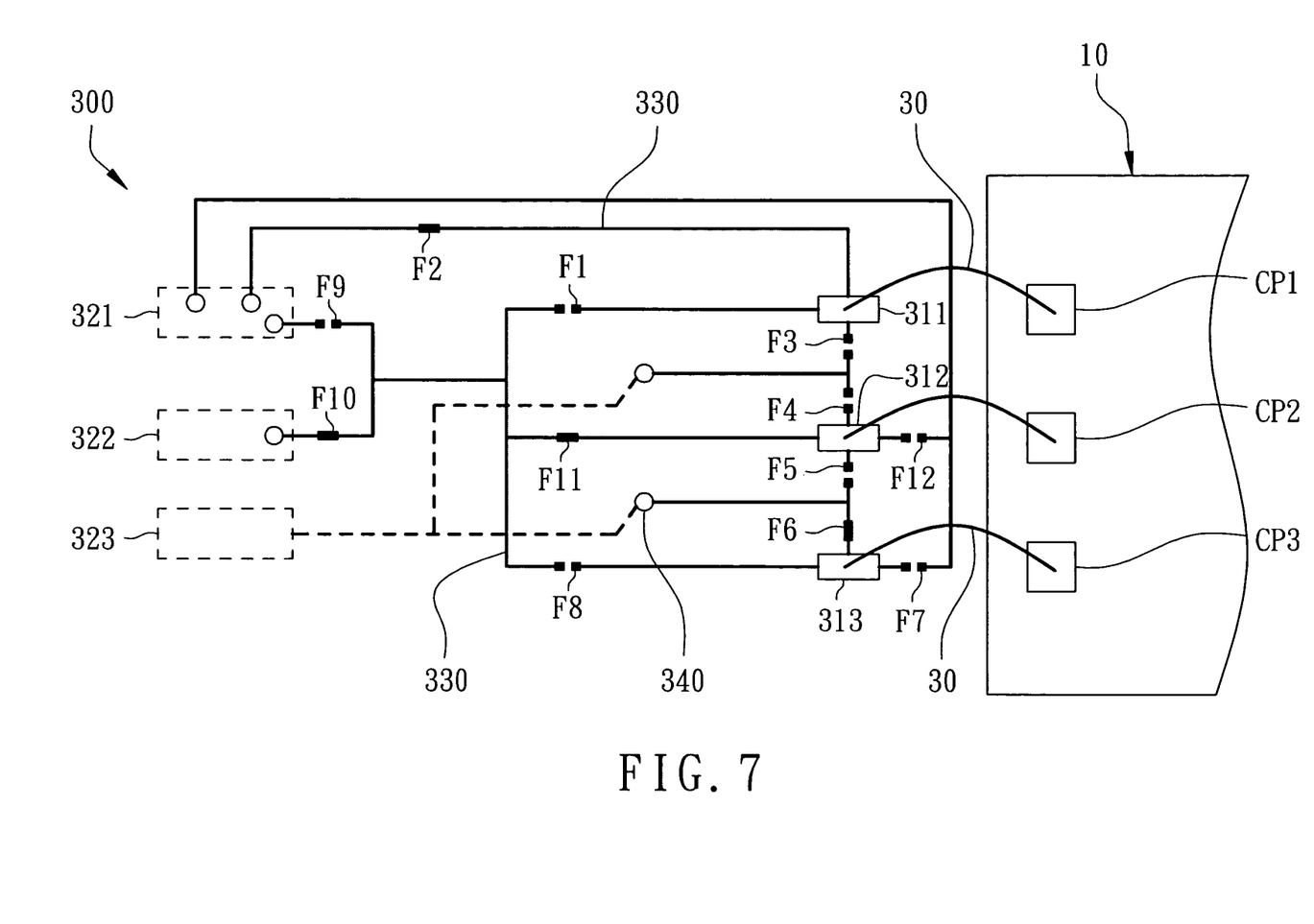
FIG. 7 shows wiring layouts on the upper surface of the universal substrate and a chip electrically connected to the universal substrate in accordance with the embodiment of the present invention.

Referring to FIG. 6 and FIG. 7, a plurality of bonding pads of a chip 10 are arranged from top to bottom in order of first bonding pad CP1, second bonding pad CP2 and third bonding pad CP3 that are numbered according to their functions. The bonding pads CP1, CP2 and CP3 are respectively connected to the first inner pad 311, the second inner pad 312 and the third inner pad 313 by the bonding wires 30, and are expected to be electrically connected to the first outer pad 321, the second outer pad 322 and the third outer pad 323. According to the row of [CP1-CP2-CP3] in FIG. 6, some fuses F1, F3, F4, F5, F7, F8, F9 and F12 should be blown out, so that the first inner pad 311 connecting to the first bonding pad CP1 is electrically connected to the first outer pad 321 via the fuse F2, the second inner pad 312 connecting to the second bonding pad CP2 is electrically connected to the second outer pad 322 via the fuses F10 and F11 and the third inner pad 313 connecting to the third bonding pad CP3 is electrically connected to the third outer pad 323 via the fuse F6, as shown in FIG. 7.

Figure 8:
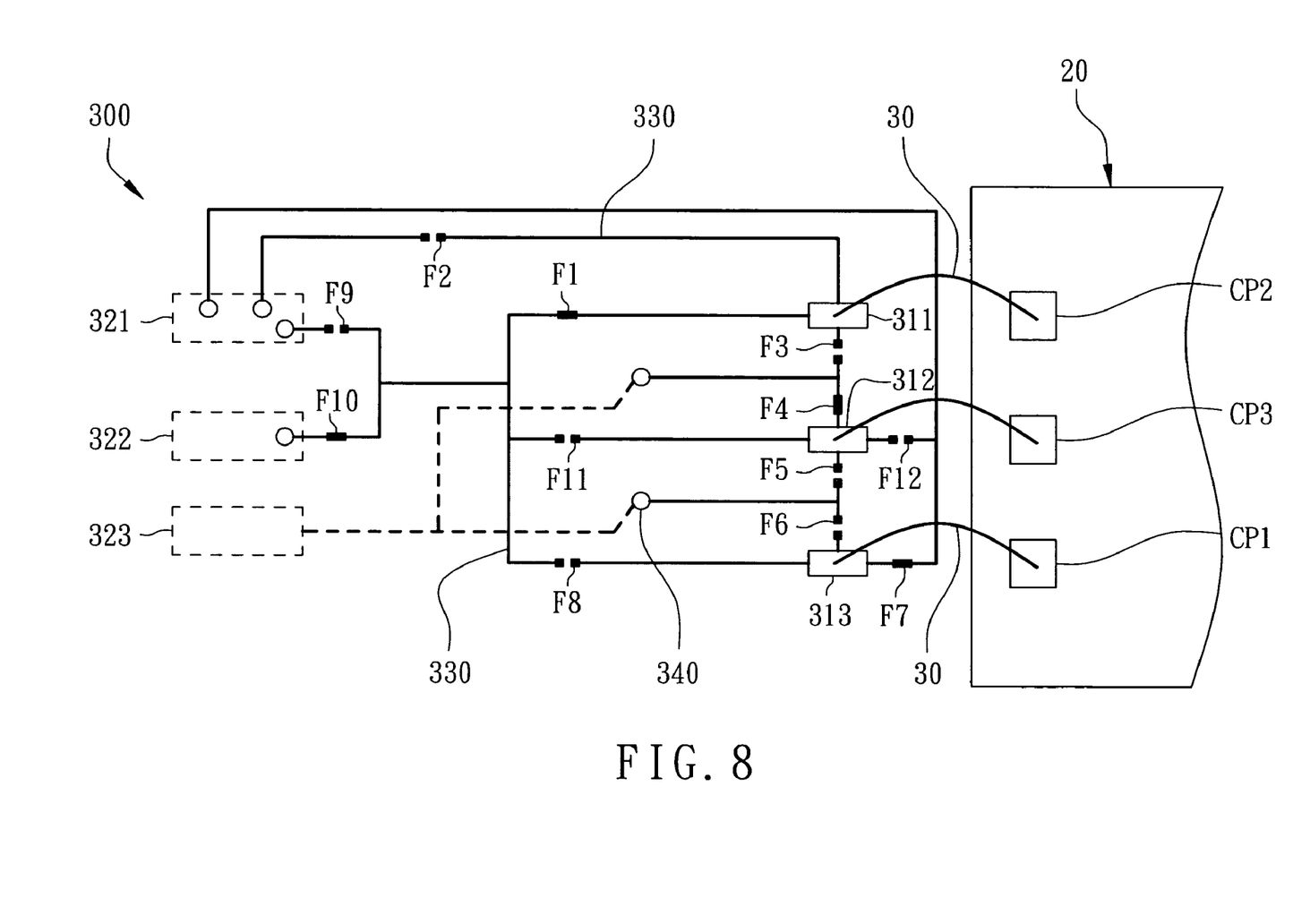
FIG. 8 shows wiring layouts on the upper surface of the universal substrate and another chip electrically connected to the universal substrate in accordance with the embodiment of the present invention.

Referring to FIG. 6 and FIG. 8, a plurality of bonding pads of another chip 20 are from up to down arranged in order of the second bonding pad CP2, the third bonding pad CP3 and the first bonding pad CP1. The bonding pads CP2, CP3 and CP1 are respectively connected to the first inner pad 311, the second inner pad 312 and the third inner pad 313 by the bonding wires 30. According to the row of [CP2-CP3-CP1] in FIG. 6, some fuses F2, F3, F5, F6, F8, F9, F11 and F12 should be blown out, so that the first inner pad 311 connecting to the second bonding pad CP2 is electrically connected to the second outer pad 322 via the fuses F1 and F10, the second inner pad 312 connecting to the third bonding pad CP3 is electrically connected to the third outer pad 323 via the fuse F4, and the third inner pad 313 connecting to the first bonding pad CP1 is electrically connected to the first outer pad 321 via the fuse F7, as shown in FIG. 8.

The wiring layout of connecting the inner pads to the outer pads may be justified by means of optionally blowing out some of the fuses F1, F2, F3, F4, F5, F6, F7, F8, F9, F10, F11 and F12 to form various electrical transmitting connections. Thus, the universal substrate 300 electrically connects different chips having various serial arrangements of bonding pads to outer pads for fitting a same socket specification without manufacturing another substrate by merely selectively blowing some of moderate fuses F1, F2, F3, F4, F5, F6, F7, F8, F9, F10, F11 and F12, which can effectively lower the manufacture cost as well as simplify material control of the substrate.

The universal substrate 300 can be further applied to a semiconductor device, such as a memory card in accordance with an embodiment of the present invention. Referring to FIG. 9, a semiconductor device mainly comprises the universal substrate 300 and a chip 10. The chip 10 is disposed on the universal substrate 300 and has a plurality of bonding pads CP1, CP2 and CP3. In this embodiment, the chip 10 is adhered onto the upper surface 301 of the universal substrate 300 using known die-attaching material and a plurality of bonding wires 30 are utilized to electrically connect the bonding pads CP1, CP2 and CP3 to the inner pads 311, 312 and 313 by wire-bonding method. The semiconductor device may further comprise a molding compound 40 to encapsulate the chip 10 and the bonding wires 30. Referring again to FIG. 9, the solder resist layer 350 covers the bifurcate wirings 330 to prevent them from contamination because of exposure resulting in a short circuit. Besides, the solder resist layer 350 has a plurality of openings 351 to expose the fuses F1, F2, F3, F4, F5, F6, F7, F8, F9, F10, F11 and F12 advantageous to allow the selective and convenient blowing of the fuses F1, F2, F3, F4, F5, F6, F7, F8, F9, F10, F11 and F12 with a laser. The fuses including F2 are encapsulated by the molding compound 40.

In this embodiment, the first bonding pad CP1 of the chip 10 is electrically connected to the first inner pad 311 by the bonding wire 30 and the first inner pad 311 is connected to the first outer pad 321 via the fuse F2, the bifurcate wirings 330 and the PTH 340.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. A universal substrate comprising:
   a plurality of inner pads and a plurality of outer pads;
   a plurality of bifurcate wirings formed on a surface of the universal substrate; and
   a plurality of fuses formed on the surface of the universal substrate and connected with the bifurcate wirings in series for allowing each of the inner pads to be electrically connected to all of the outer pads and providing optional electrical disconnections.

2. The universal substrate in accordance with claim 1, wherein at least some of the bifurcate wirings, the fuses and the inner pads are formed on an upper surface of the universal substrate, the outer pads are formed on a lower surface of the universal substrate.

3. The universal substrate in accordance with claim 2, further comprising a plurality of plated through holes (PTH) to provide double-sided electrical connections.

4. The universal substrate in accordance with claim 2, further comprising a solder resist layer formed on the upper surface of the universal substrate to cover the bifurcate wirings with the fuses exposed.

5. The universal substrate in accordance with claim 1, wherein the bifurcate wirings include T-joint or Y-joint traces.

6. The universal substrate in accordance with claim 1, wherein the fuses are narrower than the bifurcate wirings in width.

7. A universal substrate comprising a plurality of inner pads and a plurality of outer pads, further comprising a plurality of bifurcate wirings and a solder resist layer formed on a surface of the universal substrate, wherein the solder resist layer has a plurality of openings to expose some sections of the bifurcate wirings to form breakable fuses so that each of the inner pads is electrically connected to all of the outer pads with a possibility for optional electrical disconnections.

* * * * *